United States Patent
Liu et al.

(10) Patent No.: US 10,593,706 B2
(45) Date of Patent: Mar. 17, 2020

(54) ARRAY SUBSTRATE ASSEMBLY, METHOD OF MANUFACTURING ARRAY SUBSTRATE ASSEMBLY, DISPLAY PANEL AND DISPLAY APPARATUS

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Chengwei Liu, Beijing (CN); Xinjie Zhang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/578,207

(22) PCT Filed: Jul. 20, 2017

(86) PCT No.: PCT/CN2017/093690
§ 371 (c)(1),
(2) Date: Nov. 29, 2017

(87) PCT Pub. No.: WO2018/059091
PCT Pub. Date: Apr. 5, 2018

(65) Prior Publication Data
US 2018/0294283 A1 Oct. 11, 2018

(30) Foreign Application Priority Data
Sep. 30, 2016 (CN) .......................... 2016 1 0876795

(51) Int. Cl.
*H01L 27/12* (2006.01)
*H01L 21/66* (2006.01)
*H01L 27/02* (2006.01)

(52) U.S. Cl.
CPC ............ *H01L 27/124* (2013.01); *H01L 22/32* (2013.01); *H01L 27/0288* (2013.01);
(Continued)

(58) Field of Classification Search
CPC ............... H01L 27/124; H01L 27/1262; H01L 27/0292; H01L 22/32; H01L 27/1248; H01L 27/1259; H01L 27/1222
(Continued)

(56) References Cited

U.S. PATENT DOCUMENTS 5,373,379 A 12/1994 Nakai
7,439,565 B2 10/2008 Liu
(Continued)

FOREIGN PATENT DOCUMENTS

CN 1800925 A 7/2006
CN 104570515 A 4/2015
(Continued)

OTHER PUBLICATIONS

International Search Report & Written Opinion, for PCT Patent Application No. PCT/CN2017/093690, dated Sep. 12, 2017, 7 pages.
(Continued)

*Primary Examiner* — Thinh T Nguyen
(74) *Attorney, Agent, or Firm* — Kinney & Lange, P.A.

(57) ABSTRACT

The present disclosure relates to an array substrate assembly, a method of manufacturing the array substrate assembly, a display panel and a display apparatus. An array substrate assembly includes: a substrate; a first conducting wire on the substrate; a first insulating layer on the first conducting wire;
(Continued)

a second conducting wire on the first insulating layer, wherein orthogonal projections of the first conducting wire and the second conducting wire on the substrate at least partly overlap, and at least one of the first conducting wire and the second conducting wire is constituted by a plurality of conducting segments arranged discontinuously; and a connection part configured to electrically connect adjacent ones of the conducting segments of the first conducting wire or the second conducting wire.

14 Claims, 5 Drawing Sheets

(52) U.S. Cl.
CPC ...... *H01L 27/0292* (2013.01); *H01L 27/1259* (2013.01); *H01L 27/1262* (2013.01); *H01L 27/1222* (2013.01)

(58) Field of Classification Search
USPC ................. 257/59, 72, 79; 438/48, 128, 149
See application file for complete search history.

(56) References Cited

U.S. PATENT DOCUMENTS

| | | | |
|---|---|---|---|
| 9,379,137 | B2 | 6/2016 | Kim et al. |
| 2006/0139551 | A1 | 6/2006 | Kimura |
| 2015/0123136 | A1* | 5/2015 | Kim et al. .......... H01L 27/1222 257/72 |
| 2015/0263043 | A1 | 9/2015 | Chen et al. |
| 2016/0372490 | A1* | 12/2016 | Zhang et al. ......... H01L 27/124 |

FOREIGN PATENT DOCUMENTS

| | | |
|---|---|---|
| CN | 104637925 A | 5/2015 |
| CN | 106169486 A | 11/2016 |
| JP | 2015201509 A | 11/2015 |
| KR | 20140087620 A | 7/2014 |

OTHER PUBLICATIONS

Second Chinese Office Action dated Mar. 27, 2019, received for corresponding Chinese Application No. 201610876795.1.
Chinese Office Action dated Aug. 2, 2018, recieved for corresponding Chinese Application No. 201610876795.1.

* cited by examiner

ARRAY SUBSTRATE ASSEMBLY, METHOD OF MANUFACTURING ARRAY SUBSTRATE ASSEMBLY, DISPLAY PANEL AND DISPLAY APPARATUS

CROSS-REFERENCE TO RELATED APPLICATION

This application is a Section 371 National Stage Application of International Application No. PCT/CN2017/093690, filed on 20 Jul. 2017, entitled "ARRAY SUBSTRATE ASSEMBLY, METHOD OF MANUFACTURING ARRAY SUBSTRATE ASSEMBLY, DISPLAY PANEL AND DISPLAY APPARATUS", which has not yet published, which claims priority to Chinese Application No. 201610876795.1, filed on 30 Sep. 2016, incorporated herein by reference in their entirety.

BACKGROUND

1. Technical Field

At least one embodiment of the present disclosure relates to an array substrate assembly, a method of manufacturing the array substrate assembly, a display panel and a display apparatus.

2. Description of the Related Art

In a structure of an array substrate assembly, whether in a display region or in a peripheral region such as a test region (shorting bar), orthogonal projections of wirings, such as a gate layer wiring and a source and drain layer wiring, on a substrate at least partly overlap. Although an insulating layer is formed between these wirings, the longer wirings tend to cause an accumulation of static electricity, which will give rise to an electrostatic discharge (ESD) in an area where the orthogonal projections of wirings on the substrate overlap in a sequent process.

SUMMARY

In accordance with an aspect of the present disclosure, there is provided an array substrate assembly, comprising: a substrate; a first conducting wire on the substrate; a first insulating layer on the first conducting wire; a second conducting wire on the first insulating layer, wherein orthogonal projections of the first conducting wire and the second conducting wire on the substrate at least partly overlap, and at least one of the first conducting wire and the second conducting wire is constituted by a plurality of conducting segments arranged discontinuously; and a connection part configured to electrically connect adjacent ones of the conducting segments of the first conducting wire or the second conducting wire.

In embodiments of the present disclosure, the first conducting wire comprises a first conducting segment and a second conducting segment which are arranged discontinuously, and the second conducting wire is continuous.

In embodiments of the present disclosure, the array substrate assembly further comprises a second insulating layer formed on the second conducting wire and an exposed surface of the first insulating layer.

In embodiments of the present disclosure, the array substrate assembly further comprises a first via hole and a second via hole which pass through the first insulating layer and the second insulating layer, the connection part electrically connect the first conducting segment and the second conducting segment of the first conducting wire through the first via hole and the second via hole.

In embodiments of the present disclosure, the array substrate assembly further comprises: a third conducting wire on the second insulating layer; a third via hole passing through the second insulating layer and exposing the second conducting wire, wherein an orthogonal projection of the third via hole on the substrate is located within an area where the orthogonal projections of the first conducting wire and the second conducting wire on the substrate overlap; a fourth via hole passing through the first insulating layer and the second insulating layer and exposing the first conducting segment of the first conducting wire, an orthogonal projection of the first conducting segment on the substrate and the orthogonal projection of the second conducting wire on the substrate overlapping, wherein: the third conducting wire is electrically connected to the second conducting wire and the first conducting wire through the third via hole and the fourth via hole, respectively.

In embodiments of the present disclosure, the first conducting wire is located in the same layer as a gate line of the array substrate assembly, and the second conducting wire is located in the same layer as a data line of the array substrate assembly.

In embodiments of the present disclosure, the first conducting wire, the second conducting wire, the third conducting wire, and the connection part are located in a peripheral region of the array substrate assembly.

In embodiments of the present disclosure, the first conducting wire is formed of chromium, a chromium alloy material, a molybdenum tantalum alloy, aluminum, or an aluminum alloy material, the second conducting wire is formed of chromium, aluminum, or an aluminum alloy material, the third conducting wire is formed of indium tin oxide, the connection part is formed of indium tin oxide, the first insulating layer is formed of silicon oxide, silicon nitride, or aluminum oxide, the second insulating layer is formed of silicon nitride.

In accordance with another aspect of the present disclosure, there is provided a method of manufacturing an array substrate assembly, comprising: forming a first conducting wire on a substrate; forming a first insulating layer on the first conducting wire; forming a second conducting wire on the first insulating layer, wherein orthogonal projections of the first conducting wire and the second conducting wire on the substrate at least partly overlap, and at least one of the first conducting wire and the second conducting wire is constituted by a plurality of conducting segments arranged discontinuously; and forming a connection part configured to electrically connect adjacent ones of the conducting segments of the first conducting wire or the second conducting wire.

In embodiments of the present disclosure, the first conducting wire is formed into a first conducting segment and a second conducting segment which are arranged discontinuously, and the second conducting wire is formed to be continuous.

In embodiments of the present disclosure, the method further comprises: forming a second insulating layer on the second conducting wire and an exposed surface of the first insulating layer.

In embodiments of the present disclosure, the forming the connection part comprises: forming a first via hole and a second via hole which pass through the first insulating layer and the second insulating layer, wherein the first via hole and the second via hole expose the first conducting segment and the second conducting segment of the first conducting wire, respectively; forming a conducting layer on a surface of the second insulating layer and in the first via hole and the second via hole; and patterning the conducting layer to form the connection part which electrically connects the first conducting segment and the second conducting segment through the first via hole and the second via hole.

In embodiments of the present disclosure, the method further comprises: forming a third via hole and a fourth via hole prior to the forming the conducting layer, wherein the third via hole passes through the second insulating layer and exposes the second conducting wire, and an orthogonal projection of the third via hole on the substrate is located within an area where the orthogonal projections of the first conducting wire and the second conducting wire on the substrate overlap, the fourth via hole passes through the first insulating layer and the second insulating layer and exposes the first conducting segment of the first conducting wire, and an orthogonal projection of the first conducting segment on the substrate and the orthogonal projection of the second conducting wire on the substrate overlap, wherein the conducting layer is further formed in the third via hole and the fourth via hole, and the patterning the conducting layer further comprises forming a third conducting wire which electrically connects the second conducting wire and the first conducting wire through the third via hole and the fourth via hole.

In embodiments of the present disclosure, the first conducting wire and a gate line of the array substrate assembly are formed in the same layer, and the second conducting wire and a data line of the array substrate assembly are formed in the same layer.

In embodiments of the present disclosure, the first conducting wire, the second conducting wire, the third conducting wire, and the connection part are formed in a peripheral region of the array substrate assembly.

In embodiments of the present disclosure, the first conducting wire is formed of chromium, a chromium alloy material, a molybdenum tantalum alloy, aluminum, or an aluminum alloy material, the second conducting wire is formed of chromium, aluminum, or an aluminum alloy material, the third conducting wire is formed of indium tin oxide, the connection part is formed of indium tin oxide, the first insulating layer is formed of silicon oxide, silicon nitride, or aluminum oxide, the second insulating layer is formed of silicon nitride.

In accordance with a further aspect of the present disclosure, there is provided a display panel comprising: the array substrate assembly according to the embodiments of the present disclosure.

In accordance with a still another aspect of the present disclosure, there is provided a display apparatus comprising the display panel according to the embodiments of the present disclosure.

BRIEF DESCRIPTION OF THE DRAWINGS

In order to describe technical solutions according to embodiments of the present disclosure more clearly, accompanying drawings of exemplary embodiments will be simply explained as below. Apparently, the accompanying drawings in the following description are only illustrative and schematic, and are not intended to limit the present disclosure in any way. Those skilled in the art also could derive other accompanying drawings from these accompanying drawings. Aspects, and further objects and advantages of the embodiments of the present disclosure will be better understood with reference to the following detailed description of the illustrative embodiments when reading in conjunction with the accompanying drawings in which.

DETAILED DESCRIPTION OF THE EMBODIMENTS

In order that objects, technical solutions and advantages of embodiments of the present disclosure become more apparent, the embodiments of the present disclosure will be described in detail with reference to the accompanying drawings as below. Apparently, the described embodiments are only some of the embodiments of the present disclosure rather than all of the embodiments of the present disclosure.

Wording for describing feature(s), advantage(s) or the like throughout the present description does not imply that all of the feature(s) and advantage(s) that can be achieved by the present disclosure should be or are within any single embodiment of the present disclosure. On the contrary, it is to be understood that the wording relating to the feature(s) and advantage(s) means that specific feature(s), advantage(s), or characteristic(s) described in combination with the embodiment is/are included in at least one embodiment of the present disclosure. Therefore, discussion and similar wording for the features and advantages throughout the present description may refer to the same embodiment, but do not necessarily refer to the same embodiment. In addition, feature(s), advantage(s) and characteristic(s) of the present disclosure to be described may be combined in any appropriate manner in one or more embodiments. It would be appreciated by those skilled in the art that the present disclosure may be practiced without one or more specific feature(s) or advantage(s) of a particular embodiment. In other examples, additional feature(s) and advantage(s) may be achieved in some embodiments, and do not necessarily appear in all of the embodiments of the present disclosure.

In the description of the present disclosure, it is to be noted that orientations or positional relationships indicated by terms such as "upper", "lower", "top", and "bottom" are based on orientations or positional relationships shown in the accompanying drawings, are merely used to facilitate the description of the present disclosure and simplification of the description, but do not indicate or imply that a device or an element of which an orientation or positional relationship is indicated must have the particular orientation and must be configured and operated in the particular orientation. Therefore, the orientations or positional relationships should not be construed to limit the present disclosure.

Furthermore, in the description of the present disclosure, "plurality of" means two or more unless otherwise described.

Embodiments of the present disclosure provide an array substrate assembly, comprising: a substrate; a first conducting wire on the substrate; a first insulating layer on the first conducting wire; a second conducting wire on the first insulating layer, wherein orthogonal projections of the first conducting wire and the second conducting wire on the substrate at least partly overlap, and at least one of the first conducting wire and the second conducting wire is constituted by a plurality of conducting segments arranged discontinuously; and a connection part configured to electrically connect adjacent ones of the conducting segments of the first conducting wire or the second conducting wire. In order to facilitate understanding of the embodiments of the present disclosure, specific examples of the array substrate assembly are illustrated as below.

The array substrate assembly and the method of manufacturing the array substrate assembly according to at least one of the embodiments of the present disclosure can avoid, an accumulation of static electricity which is caused due to the long first or second conducting wire in the case where orthogonal projections of the first conducting wire and the second conducting wire on the substrate at least partly overlap and the insulating layer is formed between the first conducting wire and the second conducting wire, and an electrostatic discharge which occurs when accumulated static electricity is conducted to a position where the orthogonal projections of the first conducting wire and the second conducting wire on the substrate overlap.

Figure 1:
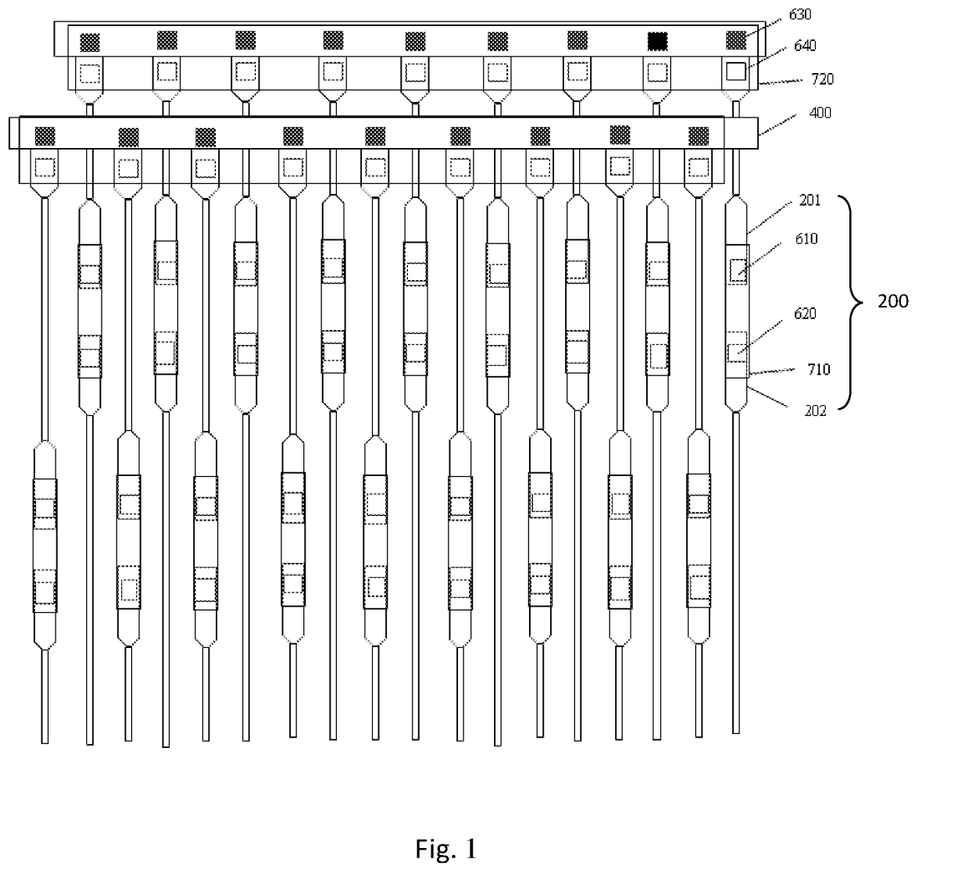
FIG. 1 shows a schematic partial plan view of an example of an array substrate assembly according to an embodiment of the present disclosure.

FIG. 1 shows a schematic partial plan view of an example of an array substrate assembly according to an embodiment of the present disclosure.

As shown in FIG. 1, the array substrate assembly comprises a first conducting wire 200, a second conducting wire 400, and a connection part 710. Orthogonal projections of the first conducting wire 200 and the second conducting wire 400 in a vertical direction partly overlap. The first conducting wire 200 comprises a first conducting segment 201 and a second conducting segment 202 which are arranged discontinuously, and the connection part 710 electrically connect the first conducting segment 201 and the second conducting segment 202.

Figure 2:
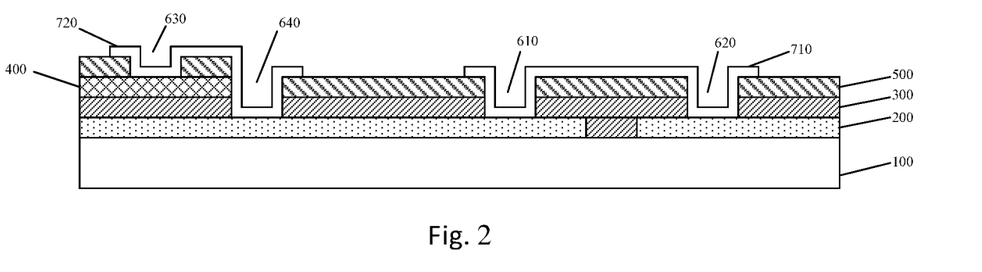
FIG. 2 shows a schematic partial sectional view of the example of the array substrate assembly according to the embodiment of the present disclosure.

FIG. 2 shows a schematic partial sectional view of the example of the array substrate assembly according to the embodiment of the present disclosure. Specifically, FIG. 2 shows a schematic partial sectional view taken along a longitudinal direction of the first conducting wire 200 in FIG. 1.

As shown in FIG. 2, the array substrate assembly further comprises a substrate 100 and a first insulating layer 300. The first conducting wire 200 is located on the substrate 100, the first insulating layer 300 is located on the first conducting wire 200, and the second conducting wire 400 is located on the first insulating layer 300. The orthogonal projections of the first conducting wire 200 and the second conducting wire 400 on the substrate 100 partly overlap.

As shown in FIG. 1, the first conducting wire 200 comprises a first conducting segment 201 and a second conducting segment 202 which are arranged discontinuously, and the second conducting wire 400 is continuous. For the sake of brevity, FIG. 1 and FIG. 2 show only two conducting segments of the first conducting wire 200 which are arranged discontinuously, but the present disclosure is not limited to this and the first conducting wire 200 may also comprise more than two conducting segments arranged discontinuously.

In this way, the first conducting wire is constituted by a plurality of conducting segments arranged discontinuously. In other words, the first conducting wire is not continuous, thereby avoiding an accumulation of static electricity which is caused due to a long conducting wire, and an electrostatic discharge which occurs when accumulated static electricity is conducted to an area where the orthogonal projections of the first conducting wire and the second conducting wire on the substrate overlap, during manufacturing of for example a passivation insulating layer.

As shown in FIG. 2, the array substrate assembly further comprises a second insulating layer 500 formed on the second conducting wire 400 and an exposed surface of the first insulating layer 300. The exposed surface of the first insulating layer 300 refers to a surface of the first insulating layer 300 which is not covered by the second conducting wire 400.

As shown in FIG. 1, the connection part 710 electrically connect the first conducting segment 201 and the second conducting segment 202 of the first conducting wire 200 through the first via hole 610 and the second via hole 620.

More specifically, as shown in FIG. 1 and FIG. 2, the array substrate assembly further comprises a first via hole 610 and a second via hole 620 which pass through the first insulating layer 300 and the second insulating layer 500. The connection part 710 electrically connect the first conducting segment 201 and the second conducting segment 202 of the first conducting wire 200 through the first via hole 610 and the second via hole 620. The first via hole 610 and the second via hole 620 expose the first conducting segment 201 and the second conducting segment 202 of the first conducting wire 200, respectively.

The schematic partial plan view of the array substrate assembly shown in FIG. 1 may be for example a schematic plan view of, for example, a test region (shorting bar) of the array substrate assembly. In detection of the array substrate assembly, quality of the array substrate assembly is detected by loading test signals to the test region.

As shown in FIG. 1, the array substrate assembly further comprises a third conducting wire 720, a third via hole 630 and a fourth via hole 640. The third conducting wire 720 electrically connects the second conducting wire 400 and the first conducting wire 200 through the third via hole 630 and the fourth via hole 640.

More specifically, as shown in FIG. 2, the third conducting wire 720 electrically connect the second conducting wire 400 and the first conducting wire 200 through the third via hole 630 passing through the second insulating layer 500 and the fourth via hole 640 passing through the first insulating layer 300 and the second insulating layer 500.

In particular, as shown in FIG. 1 and FIG. 2, an orthogonal projection of the third via hole 630 on the substrate is located within an area where the orthogonal projections of the first conducting wire 200 and the second conducting wire 400 on the substrate 100 overlap and the third via hole 630 exposes the second conducting wire 400; and the fourth via hole 640 exposes the first conducting segment 201 of the first conducting wire 200, and an orthogonal projection of the first conducting segment 201 on the substrate 100 and the orthogonal projection of the second conducting wire 400 on the substrate 100 overlap.

The schematic partial plan view of the array substrate assembly shown in FIG. 1 is a schematic plan view of, for example, a test region (shorting bar) of the array substrate assembly, but does not show a circuit in for example a display region of the array substrate assembly. However, it would be appreciated by those skilled in the art that the first conducting wire 200 may be located in the same layer as a gate line of the array substrate assembly, and the second conducting wire 400 may be located in the same layer as a data line of the array substrate assembly.

A circuit in the array substrate assembly, for example in the test region of the array substrate assembly, is generally disposed in a peripheral region of the array substrate assembly. Therefore, it would be appreciated by those skilled in the art that the first conducting wire 200, the second conducting wire 400, the third conducting wire 720 and the connection part 710 may be located in the peripheral region of the array substrate assembly.

In the present embodiment, the first conducting wire 200 may be formed of chromium, chromium alloy material, molybdenum tantalum alloy, aluminum, or aluminum alloy material.

In the present embodiment, the second conducting wire 400 may be formed of chromium, aluminum, or aluminum alloy material.

In the present embodiment, the third conducting wire 720 may be formed of indium tin oxide.

In the present embodiment, the connection part 710 may be formed of indium tin oxide.

In the present embodiment, the first insulating layer 300 may be formed of silicon oxide, silicon nitride, or aluminum oxide.

In the present embodiment, the second insulating layer 500 may be formed of silicon nitride.

Embodiments of the present disclosure also provide a method of manufacturing an array substrate assembly, and the method comprises: forming a first conducting wire on a substrate; forming a first insulating layer on the first conducting wire; forming a second conducting wire on the first insulating layer, wherein orthogonal projections of the first conducting wire and the second conducting wire on the substrate at least partly overlap, and at least one of the first conducting wire and the second conducting wire is constituted by a plurality of conducting segments arranged discontinuously; and forming a connection part configured to electrically connect adjacent ones of the conducting segments of the first conducting wire or the second conducting wire. In order to facilitate understanding of the embodiments of the present disclosure, specific examples of the method of manufacturing the array substrate assembly are illustrated as below.

Figure 3:
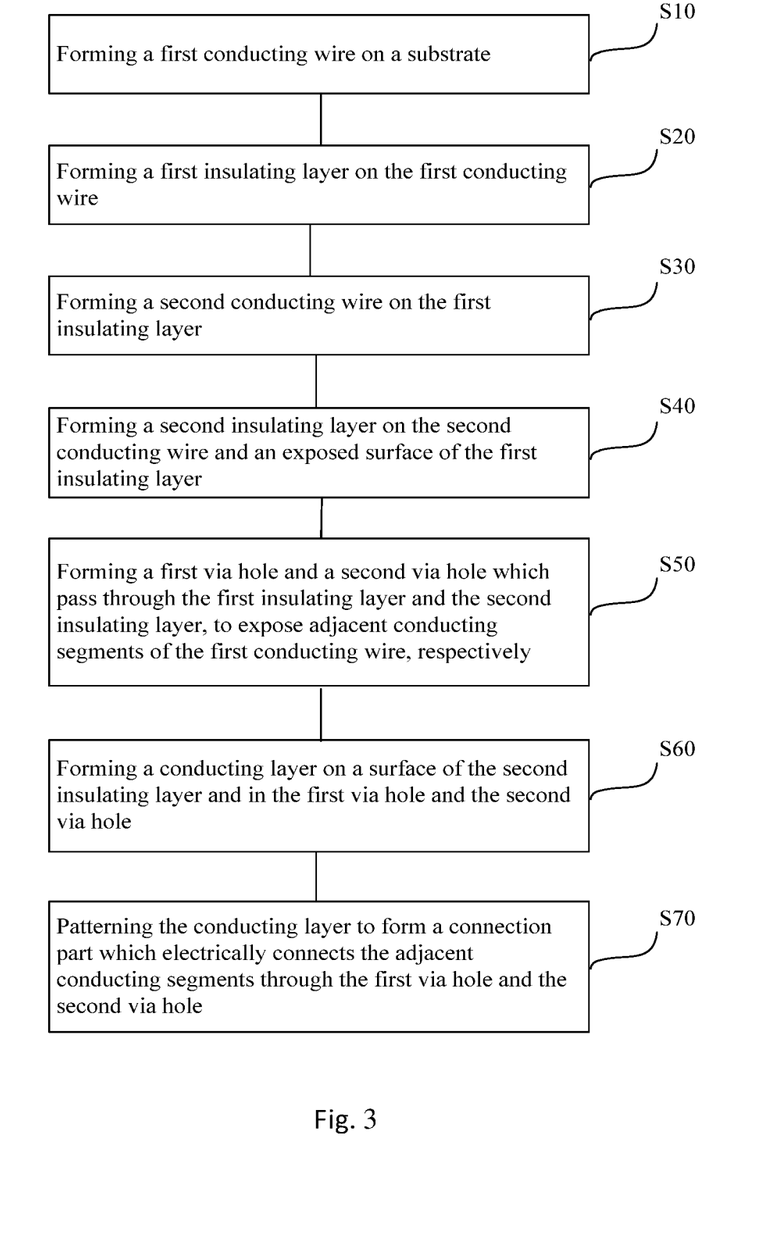
FIG. 3 shows a flow diagram of an example of a method of manufacturing an array substrate assembly according to an embodiment of the present disclosure.

FIG. 3 shows a flow diagram of an example of a method of manufacturing an array substrate assembly according to an embodiment of the present disclosure.

As shown in FIG. 3, in a step S10, a first conducting wire is formed on a substrate.

Figure 4A:
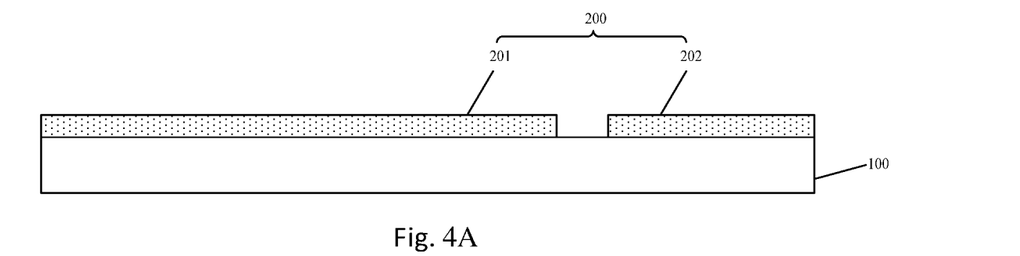
FIG. 4A shows a schematic view of a first conducting wire formed in the example of the method of manufacturing the array substrate assembly according to the embodiment of the present disclosure.

FIG. 4A shows a schematic view of a first conducting wire formed in the example of the method of manufacturing the array substrate assembly according to the embodiment of the present disclosure.

As shown in FIG. 4A, the first conducting wire 200 is formed on the substrate 100. The first conducting wire 200 is formed into a first conducting segment 201 and a second conducting segment 202 which are arranged discontinuously. For example, the first conducting wire 200 constituted by the plurality of conducting segments arranged discontinuously may be formed by forming a conducting layer on the substrate 100 and patterning the conducting layer. It would be appreciated by those skilled in the art that the patterning refers to a process technology which includes steps such as a photoresist coating, an exposing, a developing, an etching, a photoresist stripping, and the like.

For the sake of brevity, FIG. 4A shows only two conducting segments of the first conducting wire 200 which are arranged discontinuously, but the present disclosure is not limited to this and the first conducting wire 200 may also comprise more than two conducting segments arranged discontinuously.

In this way, the first conducting wire is constituted by a plurality of conducting segments arranged discontinuously. In other words, the first conducting wire is not continuous, thereby avoiding an accumulation of static electricity which is caused due to a long conducting wire, and an electrostatic discharge which occurs when accumulated static electricity is conducted to an area where the orthogonal projections of the first conducting wire and the second conducting wire on the substrate overlap, during manufacturing of for example a passivation insulating layer.

As shown in FIG. 3, in a step S20, a first insulating layer is formed on the first conducting wire.

Figure 4B:
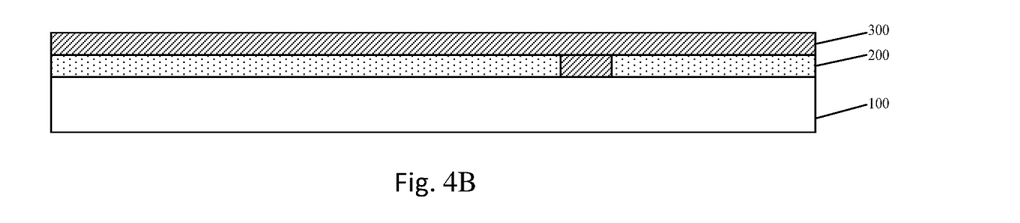
FIG. 4B shows a schematic view of a first insulating layer formed in the example of the method of manufacturing the array substrate assembly according to the embodiment of the present disclosure.

FIG. 4B shows a schematic view of a first insulating layer formed in the example of the method of manufacturing the array substrate assembly according to the embodiment of the present disclosure.

As shown in FIG. 4B, the first insulating layer 300 is formed on the first conducting wire 200, on the substrate 100 on which the step S10 has been performed. The first insulating layer 300 insulates the first conducting segment and the second conducting segment from each other.

As shown in FIG. 3, in a step S30, a second conducting wire is formed on the first insulating layer. Orthogonal projections of the first conducting wire and the second conducting wire on the substrate partly overlap.

Figure 4C:
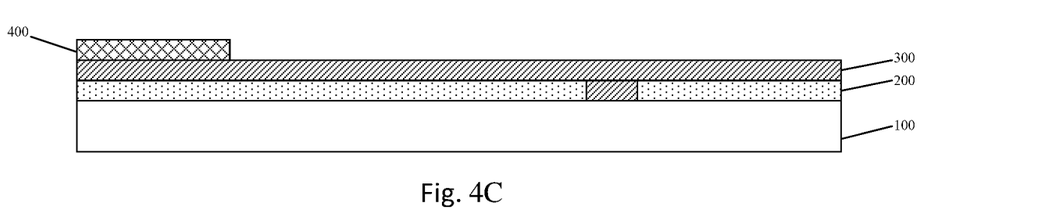
FIG. 4C shows a schematic view of a second conducting wire formed in the example of the method of manufacturing the array substrate assembly according to the embodiment of the present disclosure.

FIG. 4C shows a schematic view of a second conducting wire formed in the example of the method of manufacturing the array substrate assembly according to the embodiment of the present disclosure.

As shown in FIG. 4C, the second conducting wire 400 is formed on the first insulating layer 300, on the substrate 100 on which the step S20 has been performed. The orthogonal projections of the first conducting wire 200 and the second conducting wire 400 on the substrate partly overlap. For example, the second conducting wire 400 may be formed by forming a conducting layer on the first insulating layer 300 and patterning the conducting layer. For example, the second conducting wire 400 may be formed to be continuous.

As shown in FIG. 3, in a step S40, a second insulating layer is formed on the second conducting wire and an exposed surface of the first insulating layer. The exposed surface of the first insulating layer refers to a surface of the first insulating layer which is not covered by the second conducting wire.

Figure 4D:
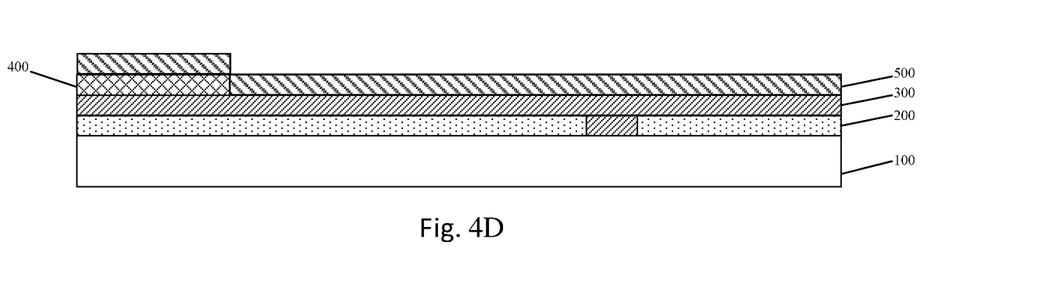
FIG. 4D shows a schematic view of a second insulating layer formed in the example of the method of manufacturing the array substrate assembly according to the embodiment of the present disclosure.

FIG. 4D shows a schematic view of a second insulating layer formed in the example of the method of manufacturing the array substrate assembly according to the embodiment of the present disclosure.

As shown in FIG. 4D, the second insulating layer 500 is formed on the second conducting wire 400 and the exposed surface of the first insulating layer 300, on the substrate 100 on which the step S30 has been performed. The exposed surface of the first insulating layer 300 refers to a surface of the first insulating layer 300 which is not covered by the second conducting wire 400.

As shown in FIG. 3, in a step S50, a first via hole and a second via hole which pass through the first insulating layer and the second insulating layer are formed to expose the first conducting segment and the second conducting segment of the first conducting wire, respectively.

If the first conducting wire and the second conducting wire belong to the circuit in the array substrate assembly, for example in the test region of the array substrate assembly, a third via hole passing through the second insulating layer and a fourth via hole passing through the first insulating layer and the second insulating layer may also be formed. An orthogonal projection of the third via hole on the substrate is located within an area where the orthogonal projections of the first conducting wire and the second conducting wire on the substrate overlap; and the third via hole exposes the second conducting wire, the fourth via hole exposes the first conducting segment of the first conducting wire, and an orthogonal projection of the first conducting segment on the substrate and the orthogonal projection of the second conducting wire on the substrate overlap.

Figure 4E:
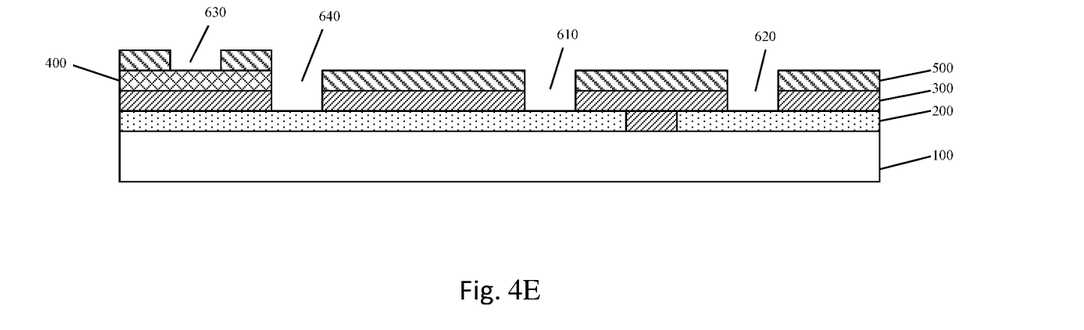
FIG. 4E shows a schematic view of a via hole formed in the example of the method of manufacturing the array substrate assembly according to the embodiment of the present disclosure.

FIG. 4E shows a schematic view of a via hole formed in the example of the method of manufacturing the array substrate assembly according to the embodiment of the present disclosure.

For example, as shown in FIG. 4E, the first via hole 610 and the second via hole 620 which pass through the first insulating layer 300 and the second insulating layer 500, the third via hole 630 passing through the second insulating layer 500, and the fourth via hole 640 passing through the first insulating layer 300 and the second insulating layer 500 are formed, on the substrate 100 on which the step S40 has been performed. The first via hole 610 and the second via hole 620 expose the first conducting segment and the second conducting segment of the first conducting wire 200; an orthogonal projection of the third via hole 630 on the substrate is located within an area where the orthogonal projections of the first conducting wire 200 and the second conducting wire 400 on the substrate 100 overlap, and the third via hole 630 exposes the second conducting wire 400; and the fourth via hole 640 exposes the first conducting segment of the first conducting wire 200, and the orthogonal projections of the first conducting segment and the second conducting wire 400 on the substrate 100 overlap. For example, the via holes may be formed in the insulating layers by patterning.

As shown in FIG. 3, in a step S60, a conducting layer is formed on a surface of the second insulating layer and in the first via hole and the second via hole.

If the first conducting wire and the second conducting wire belong to the circuit in the array substrate assembly, for example in the test region of the array substrate assembly, the conducting layer may further be formed in the third via hole and the fourth via hole.

Figure 4F:
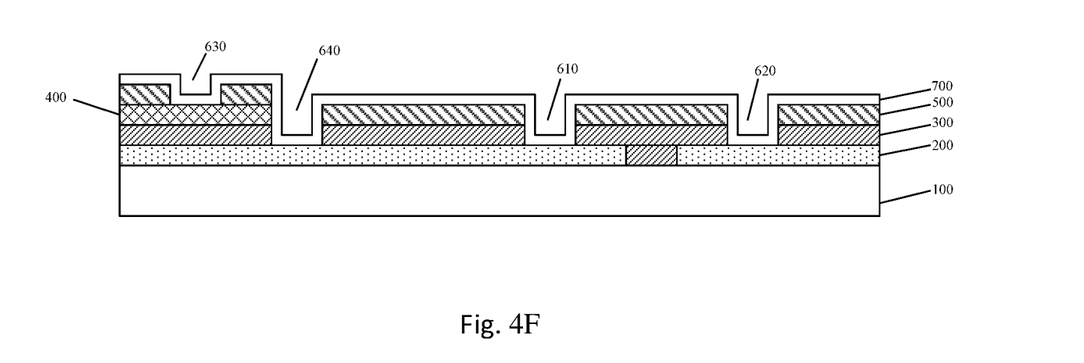
FIG. 4F shows a schematic view of a conducting layer formed in the example of the method of manufacturing the array substrate assembly according to the embodiment of the present disclosure.

FIG. 4F shows a schematic view of a conducting layer formed in the example of the method of manufacturing the array substrate assembly according to the embodiment of the present disclosure.

For example, as shown in FIG. 4F, the conducting layer 700 is formed on the surface of the second insulating layer 500 and in the first via hole 610 and the second via hole 620, on the substrate 100 on which the step S50 has been performed. The conducting layer 700 may be further formed in the third via hole 630 and the fourth via hole 640.

As shown in FIG. 3, in a step S70, the conducting layer is patterned to form the connection part which electrically connects the first conducting segment and the second conducting segment through the first via hole and the second via hole.

If the first conducting wire and the second conducting wire belong to the circuit in the array substrate assembly, for example in the test region of the array substrate assembly, the patterning the conducting layer further comprises forming a third conducting wire which electrically connects the second conducting wire and the first conducting wire through the third via hole and the fourth via hole.

Figure 4G:
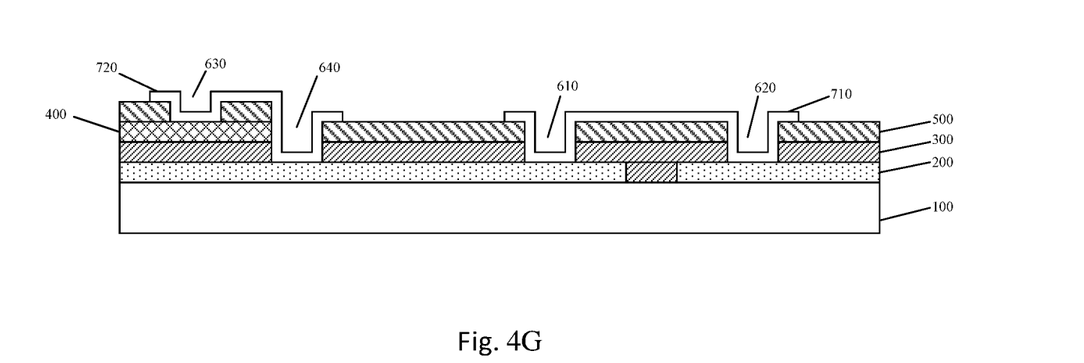
FIG. 4G shows a schematic view of the conducting layer patterned in the example of the method of manufacturing the array substrate assembly according to the embodiment of the present disclosure.

FIG. 4G shows a schematic view of the conducting layer patterned in the example of the method of manufacturing the array substrate assembly according to the embodiment of the present disclosure.

For example, as shown in FIG. 4G, on the substrate 100 on which the step S60 has been performed, the connection part 710 which electrically connects the first conducting segment and the second conducting segment through the first via hole 610 and the second via hole 620 is formed by patterning the conducting layer 700 shown in FIG. 4F, and the third conducting wire 720 which electrically connects the second conducting wire 400 and the first conducting wire 200 through the third via hole 630 and the fourth via hole 640 is further formed by patterning the conducting layer 700 shown in FIG. 4F.

For the case where the first conducting wire and the second conducting wire belong to the circuit in the array substrate assembly, for example in the test region of the array substrate assembly, it would be appreciated by those skilled in the art that the first conducting wire 200 and a gate line of the array substrate assembly may be formed in the same layer, and the second conducting wire 500 and a data line of the array substrate assembly may be formed in the same layer.

A circuit in the array substrate assembly, for example in the test region of the array substrate assembly is generally disposed in a peripheral region of the array substrate assembly. Therefore, it would be appreciated by those skilled in the art that the first conducting wire 200, the second conducting wire 400, the third conducting wire 720 and the connection part 710 may be formed in the peripheral region of the array substrate assembly.

In the present embodiment, the first conducting wire 200 may be formed of chromium, chromium alloy material, molybdenum tantalum alloy, aluminum, or aluminum alloy material.

In the present embodiment, the second conducting wire 400 may be formed of chromium, aluminum, or aluminum alloy material.

In the present embodiment, the third conducting wire 720 may be formed of indium tin oxide.

In the present embodiment, the connection part 710 may be formed of indium tin oxide.

In the present embodiment, the first insulating layer 300 may be formed of silicon oxide, silicon nitride, or aluminum oxide.

In the present embodiment, the second insulating layer 500 may be formed of silicon nitride.

In a manufacturing process of the array substrate assembly, in addition to the above steps, other necessary process steps are involved. Specific implementation of the other process steps would be known by those skilled in the art according to prior art and thus will be no longer described for the sake of brevity.

Figure 5:
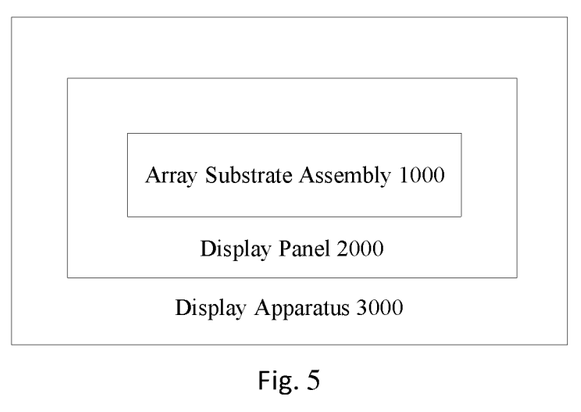
FIG. 5 shows a schematic block diagram of a display apparatus according to an embodiment of the present disclosure.

Embodiments of the present disclosure also provide a display panel 2000 which comprises the array substrate assembly 1000 according to the embodiments of the present disclosure, as shown in FIG. 5.

Embodiments of the present disclosure further provide a display apparatus 3000 which comprises the display panel 2000 according to the embodiments of the present disclosure, as shown in FIG. 5. The display apparatus may comprise any products or parts having display function such as a liquid crystal panel, an electronic paper, an OLED (organic light-emitting device) panel, a mobile phone, a tablet computer, a TV, a display, a notebook computer, a digital frame, and navigator.

While the exemplary embodiments of the present disclosure have been described with reference to the drawings, they are only illustrative and schematic description for explaining a concept of the present disclosure, rather than a limitation on aspects of the present disclosure. It should be appreciated by those skilled in the art that various modifications and changes may be made in the embodiments without departing from the spirit and principles of the present disclosure, and all of these modifications and changes fall within the protection scope of the present disclosure.

What is claimed is:

1. An array substrate assembly, comprising:
   a substrate;
   a first conducting wire on the substrate;
   a first insulating layer on the first conducting wire;
   a second conducting wire on the first insulating layer, wherein orthogonal projections of the first conducting wire and the second conducting wire on the substrate at least partly overlap, and the first conducting wire comprises a first conducting segment and a second conducting segment which are arranged discontinuously and which are adjacent to each other;
   a second insulating layer on the second conducting wire and an exposed surface of the first insulating layer;
   a first via hole and a second via hole which pass through the first insulating layer and the second insulating layer;
   a third via hole passing through the second insulating layer and exposing the second conducting wire, wherein an orthogonal projection of the third via hole on the substrate is located within an area where the orthogonal projections of the first conducting wire and the second conducting wire on the substrate overlap;
   a fourth via hole passing through the first insulating layer and the second insulating layer and exposing the first conducting segment of the first conducting wire, an orthogonal projection of the first conducting segment on the substrate and the orthogonal projection of the second conducting wire on the substrate overlapping;
   a connection part on a surface of the second insulating layer, wherein the connection part electrically connects the first conducting segment and the second conducting segment of the first conducting wire to each other through the first via hole and the second via hole; and
   a third conducting wire on the surface of the second insulating layer, wherein the third conducting wire electrically connects the second conducting wire and the first conducting wire to each other through the third via hole and the fourth via hole.

2. The array substrate assembly of claim 1, wherein:
   the second conducting wire is continuous.

3. The array substrate assembly of claim 1, wherein:
   the first conducting wire is located in the same layer as a gate line of the array substrate assembly, and the second conducting wire is located in the same layer as a data line of the array substrate assembly.

4. The array substrate assembly of claim 3, wherein:
   the first conducting wire, the second conducting wire, the third conducting wire, and the connection part are located in a peripheral region of the array substrate assembly.

5. The array substrate assembly of claim 4, wherein:
   the first conducting wire is formed of a chromium, a chromium alloy material, a molybdenum tantalum alloy, an aluminum, or an aluminum alloy material,
   the second conducting wire is formed of a chromium, an aluminum, or an aluminum alloy material,
   the third conducting wire is formed of an indium tin oxide,
   the connection part is formed of an indium tin oxide,
   the first insulating layer is formed of a silicon oxide, a silicon nitride, or an aluminum oxide, and
   the second insulating layer is formed of a silicon nitride.

6. A method of manufacturing the array substrate assembly of claim 1, the method comprising:
   forming the first conducting wire on the substrate;
   forming the first insulating layer on the first conducting wire;
   forming the second conducting wire on the first insulating layer;
   forming the second insulating layer on the second conducting wire and the exposed surface of the first insulating layer;
   forming the first via hole and the second via hole which pass through the first insulating layer and the second insulating layer, wherein the first via hole and the second via hole expose the first conducting segment and the second conducting segment of the first conducting wire, respectively;
   forming the third via hole and the fourth via hole;
   forming a conducting layer on the surface of the second insulating layer and in the first via hole, the second via hole, the third via hole and the fourth via hole; and
   patterning the conducting layer to form the connection part and the third conducting wire.

7. The method of claim 6, wherein:
   the second conducting wire is formed to be continuous.

8. The method of claim 6, wherein:
   the first conducting wire and a gate line of the array substrate assembly are formed in the same layer, and the second conducting wire and a data line of the array substrate assembly are formed in the same layer.

9. The method of claim 8, wherein:
the first conducting wire, the second conducting wire, the third conducting wire, and the connection part are formed in a peripheral region of the array substrate assembly.

10. The method of claim 9, wherein:
the first conducting wire is formed of a chromium, a chromium alloy material, a molybdenum tantalum alloy, an aluminum, or an aluminum alloy material,
the second conducting wire is formed of a chromium, an aluminum, or an aluminum alloy material,
the third conducting wire is formed of an indium tin oxide,
the connection part is formed of an indium tin oxide,
the first insulating layer is formed of a silicon oxide, a silicon nitride, or an aluminum oxide, and
the second insulating layer is formed of a silicon nitride.

11. A display panel comprising:
the array substrate assembly according to claim 1.

12. A display apparatus comprising:
the display panel according to claim 11.

13. The array substrate assembly of claim 1, wherein:
the first conducting wire and the second conducting wire cross each other.

14. The array substrate assembly of claim 1, wherein:
the first conducting segment and the second conducting segment of the first conducting wire, and the connection part extend in the same direction.

* * * * *